United States Patent [19]
Andoh

[11] Patent Number: 5,908,309
[45] Date of Patent: Jun. 1, 1999

[54] FABRICATION METHOD OF SEMICONDUCTOR DEVICE WITH CMOS STRUCTURE

[75] Inventor: Takeshi Andoh, Tokyo, Japan

[73] Assignee: NEC Corporation, Tokyo, Japan

[21] Appl. No.: 09/067,861

[22] Filed: Apr. 28, 1998

[30] Foreign Application Priority Data

Apr. 30, 1997 [JP] Japan ................................. 9-126277

[51] Int. Cl.⁶ ................... H01L 21/8238; H01L 21/04; H01L 21/425
[52] U.S. Cl. .................. 438/231; 438/510; 438/527; 438/919
[58] Field of Search .................... 438/583, 482, 438/919, 649, 510, 760, 519, 966, 527, FOR 338, 360, 206, 231

[56] References Cited

U.S. PATENT DOCUMENTS 5,273,914 12/1993 Miyajima et al. .................... 438/231
5,290,712 3/1994 Sato et al. ............................ 438/798

FOREIGN PATENT DOCUMENTS 8078361 3/1996 Japan .

Primary Examiner—John F. Niebling
Assistant Examiner—C. Lattin

[57] ABSTRACT

A fabrication method of a semiconductor device with the CMOS structure, which suppresses the sheet resistance of silicide layers of a refractory metal in an n-channel MOSFET at a satisfactorily low level while preventing the junction leakage current in a p-channel MOSFET from increasing. An n-type dopant is selectively ion-implanted into surface areas of a first pair of n-type source/drain regions and a surface area of a first gate electrode in an NMOS region at a first acceleration energy, thereby forming a first plurality of amorphous regions in the NMOS region. The n-type dopant is ion-implanted into surface areas of the second pair of p-type source/drain regions and a surface area of the second gate electrode in a PMOS region at a second acceleration energy lower than the first acceleration energy, thereby forming second plurality of amorphous regions in the PMOS region. The second acceleration energy is set in such a way that bottoms of the second pair of p-type source/drain regions in the PMOS region are not substantially shifted due to ion implantation of the n-type dopant for forming the second plurality of amorphous regions.

7 Claims, 7 Drawing Sheets

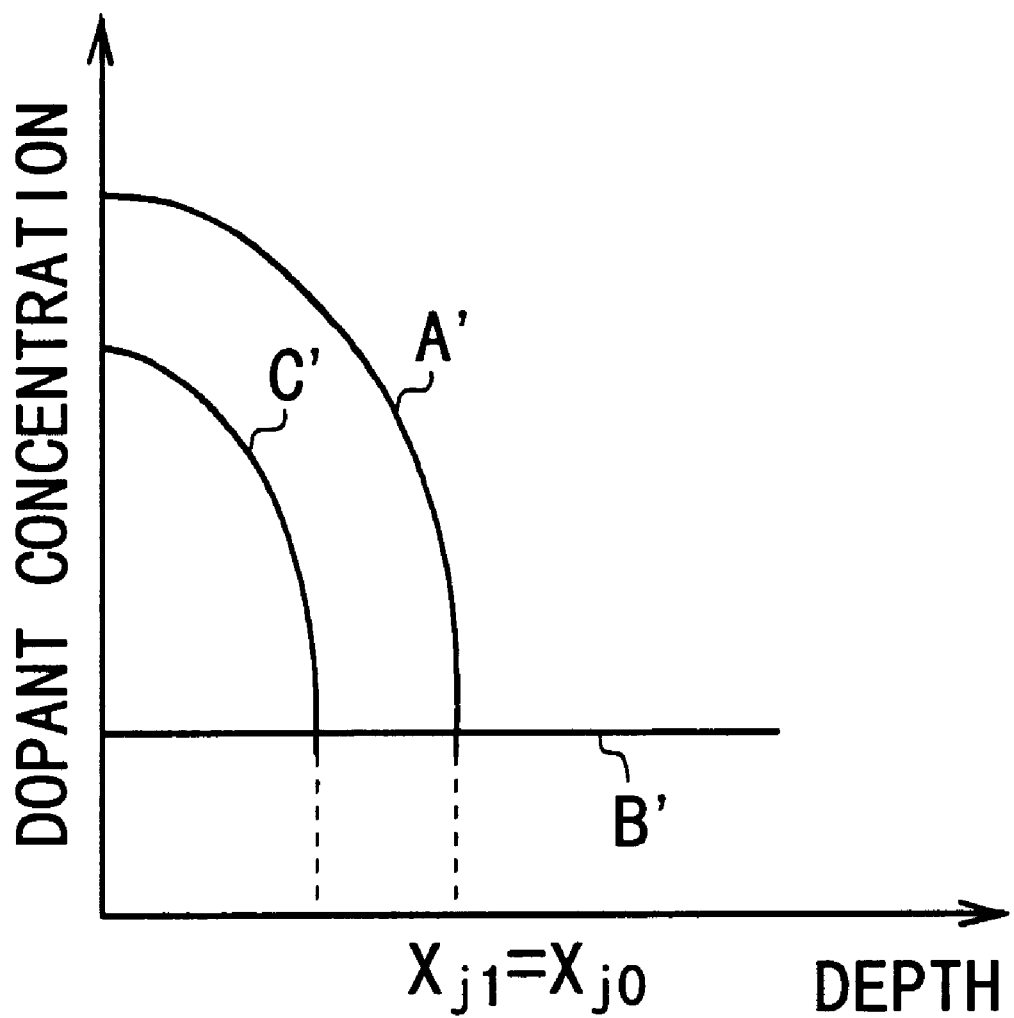

FABRICATION METHOD OF SEMICONDUCTOR DEVICE WITH CMOS STRUCTURE

BACKGROUND OF THE INVENTION

1. Field of the Invention

The present invention relates to a fabrication method of a semiconductor device and more particularly, to a fabrication method of a semiconductor device with the Complementary Metal-Oxide-Semiconductor (CMOS) structure, in which silicide layers of a refractory metal are formed in self-alignment in the surface areas of gate electrodes and source/drain regions of n- and p-channel MOS Field-Effect Transistors (MOSFETs).

2. Description of the Prior Art

A conventional fabrication method of a semiconductor device of this sort is shown in FIGS. 1A to 1C, which is disclosed in the Japanese Non-Examined Patent Publication No. 8-78361 published in 1996.

This method employs the known Self-Aligned siLICIDE (SALICIDE) process and provides refractory-metal silicide layers with low electric resistance while preventing the short circuit between wiring lines.

In this method, amorphous silicon layers or regions are formed in the surface areas of impurity-doped silicon regions of a single-crystal silicon (Si) substrate. Next, a refractory metal such as titanium (Ti) is deposited on the amorphous silicon layers or regions while heating the substrate to a temperature at which no silicide of the deposited refractory metal is generated. Finally, the substrate is subjected to a heat treatment for silicidation reaction so that the amorphous silicon layers react with the deposited refractory metal to thereby form silicide layers of the deposited refractory metal.

First, as shown in FIG. 1A, a field oxide layer 104 with a thickness of 200 to 400 nm is selectively formed in the surface area of a p-type single-crystal silicon substrate 101 by the selective oxidation technique, thereby defining an NMOS region 121 where an n-channel MOSFET is formed and a PMOS region 122 where a p-channel MOSFET in the surface area of the substrate 101.

Next, a p-type well region 102 and an n-type well region 103 are formed in the NMOS and PMOS regions 121 and 122 by the ion-implantation technique, respectively.

Then, gate oxide layers 105 with a thickness of 3 to 6 nm are formed on the exposed surfaces of the NMOS and PMOS regions 121 and 122 by the thermal oxidation technique. Subsequently, polysilicon gate electrodes 106 with a thickness of 150 to 250 nm are formed on the gate oxide layers 105 in the NMOS and PMOS regions 121 and 122 by the Chemical Vapor Deposition (CVD), photolithography, and etching techniques.

Pairs of oxide sidewalls 107 with a width of 80 to 150 nm are then formed on the gate oxide layers 105 at each side of the corresponding gate electrodes 106 in the NMOS and PMOS regions 121 and 122 by using the CVD and anisotropic etching techniques.

An oxide layer 108 with a thickness of 5 to 10 nm is formed to entirely cover the NMOS and PMOS regions 121 and 122 by the CVD technique.

Further, a pair of n-type source/drain regions 109 and a pair of p-type source/drain regions 110 are formed in the NMOS and PMOS regions 121 and 122 through the oxide layer 108 by the ion-implantation technique and the annealing technique, respectively.

When the pair of n-type source/drain regions 109 are formed in the NMOS region 121, arsenic (As) ions as an n-type dopant are selectively implanted into the NMOS region 121 with a dose of 2 to $5 \times 10^{15}$ atoms/cm$^2$ at an acceleration energy of 20 to 50 keV while the PMOS region 122 is covered with a patterned photoresist film (not shown). When the pair of p-type source/drain regions 110 are formed in the PMOS region 122, boron difluoride (BF$_2$) ions as a p-type dopant are selectively implanted into the PMOS region 122 with a dose of 2 to $5 \times 10^{15}$ atoms/cm$^2$ at an acceleration energy of 20 to 50 keV while the NMOS region 121 is covered with a patterned photoresist film (not shown).

The pair of n-type source/drain regions 109 and the pair of p-type source/drain regions 110 thus formed are then subjected to an annealing process for activating the implanted arsenic and boron atoms. This annealing process is typically carried out at a temperature of 1000 to 1050° C. for 10 to 30 seconds.

The state at this stage is shown in FIG. 1A.

Following the annealing process, as shown in FIG. 1B, arsenic ions are implanted again into the pairs of the n- and p-type source/drain regions 109 and 110 and the gate electrodes 106 in the NMOS and PMOS regions 121 and 122 through the oxide layer 108, as indicated by vertical arrows 115. Thus, amorphous silicon regions 106a are formed by the surface areas of the gate electrodes 106 in the NMOS and PMOS regions 121 and 122 and at the same time, amorphous silicon regions 109a and 110a are formed by the surface areas of the pairs of n- and p-type source/drain regions 109 and 110 in the NMOS and PMOS regions 121 and 122, respectively.

The reason because arsenic is selected for the ion-implantation species in this process is that arsenic has a largest mass number within the popularly-used n-type dopants in the semiconductor device fabrication and therefore, arsenic is optimum for this purpose.

Further, the oxide layer 108 is removed to expose the amorphous silicon regions 106a of the gate electrodes 106 and the amorphous silicon regions 109a and 110a of the pairs of source/drain regions 109 and 110 from the oxide layer 108. Then, a titanium (Ti) layer (not shown) with a thickness of 20 to 40 nm is deposited to cover the entire surface of the substrate 101 by the sputtering technique. The titanium layer is contacted with the exposed amorphous silicon regions 106a of the gate electrodes 106 and the exposed amorphous silicon regions 109a and 110a of the pairs of source/drain regions 109 and 110.

The titanium layer and the entire substrate 101 are subjected to a heat treatment at a temperature of 650 to 750° C. for 10 to 30 seconds, thereby reacting the titanium layer with the amorphous silicon regions 106a of the gate electrodes 106 and the amorphous silicon regions 109a and 110a of the pairs of source/drain regions 109 and 110. Through this heat treatment, the titanium silicide (TiSi$_2$) layers 111 with a thickness of 30 to 60 nm are formed in self-alignment to the gate electrodes 106 and the pairs of source/drain regions 109 and 110 due to silicidation reaction, respectively.

The unreacted titanium layer is then removed. The state at this stage is shown in FIG. 1C.

Finally, the titanium silicide layers 111 are subjected to a heat-treatment at a temperature of 800 to 900° C. for 10 to 30 seconds, thereby causing the phase transition in the layers 111 to decrease their electric resistivity.

With the conventional fabrication method of a semiconductor device shown in FIGS. 1A to 1C, however, the following problem will occur.

There is a tendency that the silicidation reaction of titanium (Ti) with silicon (Si) into which arsenic (As) ions have been implanted with the dose of 2 to $5 \times 10^{15}$ atoms/cm$^2$ is more difficult to progress than the case where boron difluoride (BF$_2$) ions are implanted thereinto instead of arsenic. Therefore, when the acceleration energy of arsenic ions is low, the thickness of the titanium silicide layers 111 in the NMOS region 121 becomes small compared with the titanium silicide layers 111 in the PMOS region 122.

In this case, the titanium silicide layers 111 in the NMOS region 121 tend to have an unsatisfactory small thickness, even if the titanium silicide layers 111 in the PMOS region 122 have a satisfactory large thickness. As a result, agglomeration of titanium silicide tends to occur in the titanium silicide layers 111 during the subsequent heat-treatment process for activating the implanted arsenic atoms, thereby increasing conspicuously the sheet resistance of the titanium silicide layers 111 in the NMOS region 121.

To avoid such the sheet resistance increase of the titanium silicide layers 111 in the NMOS region 121 as described above, it is popular that the acceleration energy of arsenic ions is set as high as possible to thereby increase the resultant thickness of the amorphous silicon regions 106a, 109a, and 110a in the NMOS and PMOS regions 121 and 122. The increased thickness of the amorphous silicon regions 106a, 109a, and 110a accelerates the silicidation reaction of titanium with arsenic-implanted amorphous silicon and consequently, the above problem of the sheet resistance increase of the titanium silicide layers 111 in the NMOS region 121 can be prevented from occurring.

However, the increased thickness of the amorphous silicon regions 106a and 110a in the PMOS region 122 will cause another problem that the junction leakage current of the pair of p-type source/drain regions 110 in the PMOS region 122 becomes high.

The inventor found that this problem is due to the following reason.

FIG. 2 schematically shows the profile of the dopant concentration of the pairs of p-type source/drain regions 110 in the PMOS region 122 as a function of depth.

In FIG. 2, the curve A indicates the dopant concentration distribution due to the boron-difluoride-ion implantation for forming the pair of p-type source/drain regions 110. The straight line B indicates the dopant concentration distribution of the n-type well region 103. The curve C indicates the dopant concentration distribution due to the arsenic-ion implantation for forming the amorphous silicon regions 110a in the pair of p-type source/drain regions 110. The curve D indicates the resultant or overall dopant concentration distribution of the pair of p-type source/drain regions 110 after the arsenic-ion implantation for forming the amorphous silicon regions 110a.

As seen from FIG. 2, the depth $X_{j0}$ of the p–n junctions of the pair of p-type source/drain regions 110 before the arsenic-ion implantation for forming the amorphous silicon regions 110a is given by the intersection of the curve A and the straight line B. On the other hand, the depth $X_{j1}$ of the p–n junctions of the pair of p-type source/drain regions 110 after the arsenic-ion implantation for forming the amorphous silicon regions 110a is given by the intersection of the curve D and the straight line B.

It is clear that the depth $X_{j1}$ is smaller than the depth $X_{j0}$. This is caused by the fact that the p-type dopant (i.e., BF$_2$) doped into the pair of p-type source/drain regions 110 is canceled or eliminated by the n-type dopant (i.e., As) at the tail or bottom of the distribution of the implanted p-type dopant (i.e., BF$_2$), i.e., in the vicinity of the p–n junctions of the p-type source/drain regions 110. As a result, the tail or bottom of the distribution of the implanted p-type dopant is raised toward the surfaces of the regions 110. In other words, the p–n junctions of the pair of p-type source/drain regions 110 become shallow. These shallow p–n junctions increase the junction leakage current of the pair of p-type source/drain regions 110 in the PMOS region 122 due to spikes or crystal defects.

Concretely, to fabricate a p- or n-channel MOSFET having a gate length of approximately 0.15 $\mu$m, the depth of the p–n junctions of a pair of source/drain regions with respect to their surfaces needs to be set as approximately 0.15 $\mu$m or less from the viewpoint of suppression of the short channel effect.

On the other hand, to set the sheet resistance of a titanium silicide layer in a gate electrode of an n-channel MOSFET at 10 $\Omega/\square$ or less, the acceleration energy of an n-type dopant (i.e., As ions) for forming an amorphous region in the gate electrode needs to be set as 60 keV or higher. However, if arsenic ions are implanted at an acceleration energy of 60 keV or higher with a dose of 2 to $5 \times 10^{14}$ atoms/cm$^2$, the tail or bottom of the implanted arsenic ions will have a depth of 0.1 $\mu$m or larger.

Thus, the bottom or tail of the distribution of the implanted p-type dopant (i.e., BF$_2$ ions) for forming the p-type source/drain regions 110 is canceled by the implanted n-type dopant (i.e., As ions) for forming the amorphous region, thereby decreasing the depth of the p–n junctions of the pair of p-type source/drain regions 110.

SUMMARY OF THE INVENTION

Accordingly, an object of the present invention is to provide a fabrication method of a semiconductor device with the CMOS structure that suppresses the sheet resistance of silicide layers of a refractory metal in an n-channel MOSFET at a satisfactorily low level while preventing the junction leakage current in a p-channel MOSFET from increasing.

The above object together with others not specifically mentioned will become clear to those skilled in the art from the following description.

A fabrication method of a semiconductor device according to the present invention is comprised of the following steps (a) to (h).

(a) An NMOS region in which an n-channel MOSFET is formed and a PMOS region in which a p-channel MOSFET is formed are defined in a semiconductor substrate.

(b) First and second gate electrodes are formed over the NMOS and PMOS regions through first and second gate insulating layers, respectively.

(c) A first pair of n-type source/drain regions are formed in the NMOS region.

(d) A second pair of p-type source/drain regions are formed in the PMOS region.

(e) An n-type dopant is selectively ion-implanted into surface areas of the first pair of n-type source/drain regions and a surface area of the first gate electrode in the NMOS region at a first acceleration energy, thereby forming a first plurality of amorphous regions by the surface areas of the first pair of n-type source/drain regions and the first gate electrode in the NMOS region.

(f) The n-type dopant is ion-implanted into surface areas of the second pair of p-type source/drain regions and a surface area of the second gate electrode in the PMOS region at a second acceleration energy lower than the first acceleration energy, thereby forming second plurality of amorphous regions by the surface areas of the second pair of p-type source/drain regions and the second gate electrode in the PMOS region.

The second acceleration energy is set in such a way that bottoms of the second pair of p-type source/drain regions in the PMOS region are not substantially shifted due to ion implantation of the n-type dopant for forming the second plurality of amorphous regions.

(g) A refractory metal layer is formed to be contacted with the first plurality of amorphous regions in the NMOS region and the second plurality of amorphous regions in thePMOS region.

(h) The refractory metal layer, the first plurality of amorphous regions in the NMOS region, and the second plurality of amorphous regions in the PMOS region are heat-treated to form silicide layers in self-alignment to the first and second gate electrodes and the first and second pluralities of the pairs of source/drain regions due to silicidation reaction.

With the fabrication method of a semiconductor device according to the present invention, an n-type dopant is selectively ion-implanted into surface areas of a first pair of n-type source/drain regions and a surface area of a first gate electrode in an NMOS region at a first acceleration energy, thereby forming a first plurality of amorphous regions by the surface areas of the first pair of n-type source/drain regions and the first gate electrode in the NMOS region in the step (e). Also, the n-type dopant is ion-implanted into surface areas of the second pair of p-type source/drain regions and a surface area of the second gate electrode in the PMOS region at a second acceleration energy lower than the first acceleration energy, thereby forming second plurality of amorphous regions by the surface areas of the second pair of p-type source/drain regions and the second gate electrode in the PMOS region in the step (f).

Moreover, the second acceleration energy in the step (f) is set in such a way that bottoms of the second pair of p-type source/drain regions in the PMOS region are not substantially shifted due to ion implantation of the n-type dopant for forming the second plurality of amorphous regions.

Therefore, the p–n junctions of the second pair of p-type source/drain regions in the PMOS region do not become shallow even the n-type dopant is ion-implanted into the second pair of p-type source/drain regions in the step (f). This means that the junction leakage current in the p-channel MOSFET is prevented from increasing.

Further, by setting the first acceleration energy in such a way that the first plurality of amorphous regions in the NMOS region have a satisfactory thickness, the sheet resistance of the silicide layers in the n-channel MOSFET can be suppressed at a satisfactorily low level.

In a preferred embodiment of the method according to the present invention, the step (e) is performed while selectively covering the PMOS region by a first mask, and the step (f) is performed while selectively covering the NMOS region by a second mask.

In another preferred embodiment of the method according to the present invention, the step (e) is performed while selectively covering the PMOS region by a mask, and the step (f) is performed while covering the NMOS and PMOS regions with no mask.

In this case, there is an additional advantage that no formation process of a mask for covering the NMOS region is necessary.

In still another preferred embodiment of the method according to the present invention, the first pair of n-type source/drain regions are formed while selectively covering the PMOS region by a heat-resistant mask in the step (c) and then, the first pair of n-type source/drain regions are subjected to a heat treatment for annealing without removing the mask used in the step (c). Further, the step (e) is performed using the same mask. The step (e) may be performed with or without the same mask.

In this case, there is an additional advantage that no formation process of a mask for covering the PMOS region in the step (e) is necessary.

The heat-resistant mask is preferably made of polysilicon, because a polysilicon mask has a required heat resistance and is very easy to be fabricated. The heat-resistant mask may be made of silicon nitride.

It is preferred that the refractory metal layer is made of titanium (Ti), because titanium silicide has a very low electric resistance. However, any other refractory metal other than titanium may be used.

It is preferred that the n-type dopant is phosphorus (P), arsenic (As), or antimony (Sb). The most preferred n-type dopant is arsenic (As).

BRIEF DESCRIPTION OF THE DRAWINGS

In order that the present invention may be readily carried into effect, it will now be described with reference to the accompanying drawings.

FIG. 4 schematically shows the profile of the dopant concentration of the pairs of p-type source/drain regions as a function of depth in the semiconductor device fabricated by the method according to the first embodiment.

DETAILED DESCRIPTION OF THE PREFERRED EMBODIMENTS

Figure 1A:
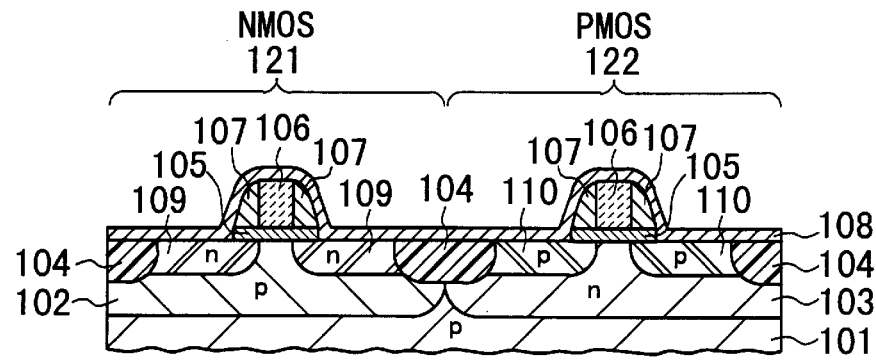
FIGS. 1A to 1C are partial, cross-sectional views showing a conventional fabrication method of a semiconductor device with the CMOS structure, respectively.

Preferred embodiments of the present invention will be described in detail below while referring to the drawings attached.

FIRST EMBODIMENT

A fabrication method of a semiconductor device with the CMOS structure according to a first embodiment of the present invention includes the steps as shown in FIGS. 3A to 3D.

Figure 3A:
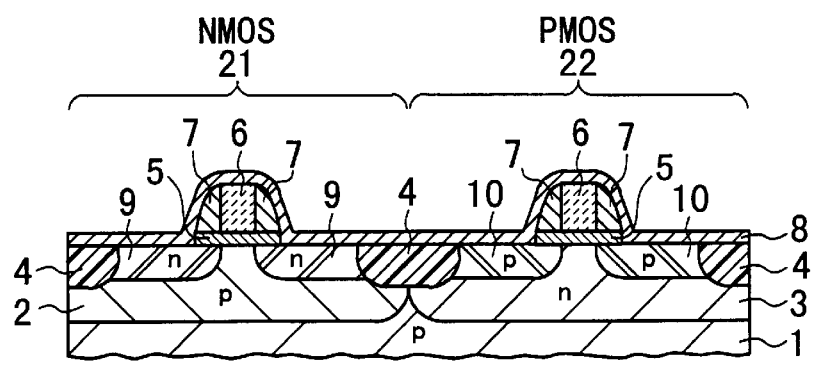
FIGS. 3A to 3D are partial, cross-sectional views showing a fabrication method of a semiconductor device with the CMOS structure according to a first embodiment of the present invention, respectively.

First, as shown in FIG. 3A, a field oxide layer 4 with a thickness of 200 to 400 nm (e.g., 300 nm) is selectively formed in the surface area of a p-type single-crystal silicon substrate 1 by the selective oxidation technique, thereby defining an NMOS region 21 where an n-channel MOSFET is formed and a PMOS region 22 where a p-channel MOSFET in the surface area of the substrate 1.

Next, a p-type well region 2 and an n-type well region 3 are formed in the NMOS and PMOS regions 21 and 22 by the ion-implantation technique, respectively.

Then, gate oxide layers 5 with a thickness of 3 to 6 nm (e.g., 5 nm) are formed on the exposed surfaces of the NMOS and PMOS regions 21 and 22 by the thermal oxidation technique. Subsequently, polysilicon gate electrodes 6 with a thickness of 150 to 250 nm (e.g., 200 nm) are formed on the gate oxide layers 5 in the NMOS and PROS regions 21 and 22 by the CVD, photolithography, and etching techniques.

Pairs of oxide sidewalls 7 with a width of 80 to 150 nm (e.g., 100 nm) are then formed on the gate oxide layers 5 at each side of the corresponding gate electrodes 6 in the NMOS and PMOS regions 21 and 22 by using the CVD technique and the anisotropically etching technique.

A silicon dioxide ($SiO_2$) layer 8 with a thickness of 5 to 10 nm (e.g., 10 nm) is formed to entirely cover the NMOS and PMOS regions 21 and 22 by the CVD technique.

Further, a pair of n-type source/drain regions 9 and a pair of p-type source/drain regions 10 are formed in the NMOS and PMOS regions 21 and 22 by the ion-implantation technique and the annealing technique, respectively.

When the pair of n-type source/drain regions 9 are formed in the NMOS region 21, arsenic (As) ions as an n-type dopant are selectively implanted into the NMOS region 21 with a dose of 2 to $5 \times 10^{15}$ atoms/$cm^2$ (e.g., $3 \times 10^{15}$ atoms/$cm^2$) at an acceleration energy of 20 to 50 keV (e.g., 30 keV) while the PMOS region 22 is covered with a patterned photoresist film (not shown). When the pair of p-type source/drain regions 10 are formed in the PMOS region 22, boron difluoride ($BF_2$) ions as a p-type dopant are selectively implanted into the PMOS region 22 with a dose of 2 to $5 \times 10^{15}$ atoms/$cm^2$ (e.g., $3 \times 10^{15}$ atoms/$cm^2$) at an acceleration energy of 20 to 50 keV (e.g., 20 keV) while the NMOS region 21 is covered with a patterned photoresist film (not shown).

The pair of n-type source/drain regions 9 and the pair of p-type source/drain regions 10 thus formed are then subjected to an annealing process for activating the implanted arsenic and boron atoms. This annealing process is typically carried out at a temperature of 1000 to 1050° C. (e.g., 1050° C.) for 10 to 30 seconds (e.g., 10 seconds).

Figure 1B:
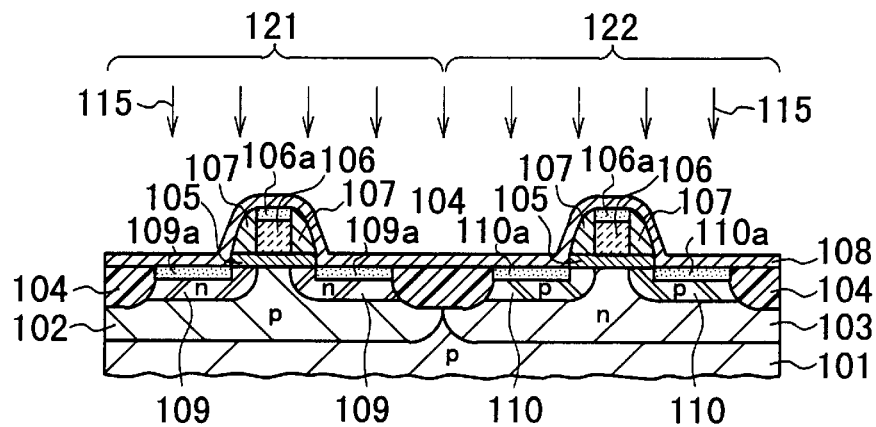
Figure 1C:
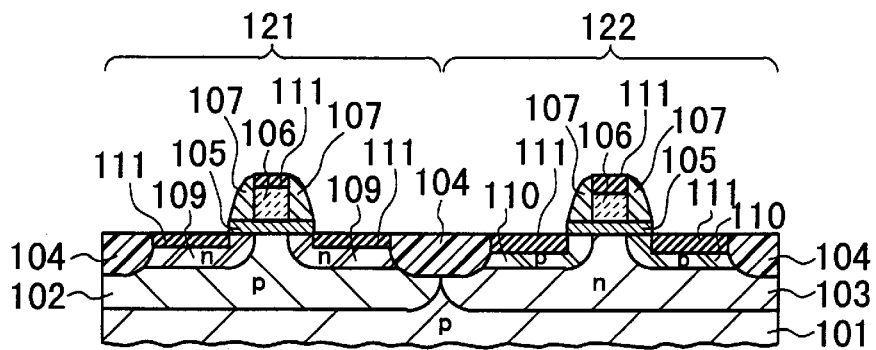
Figure 2:
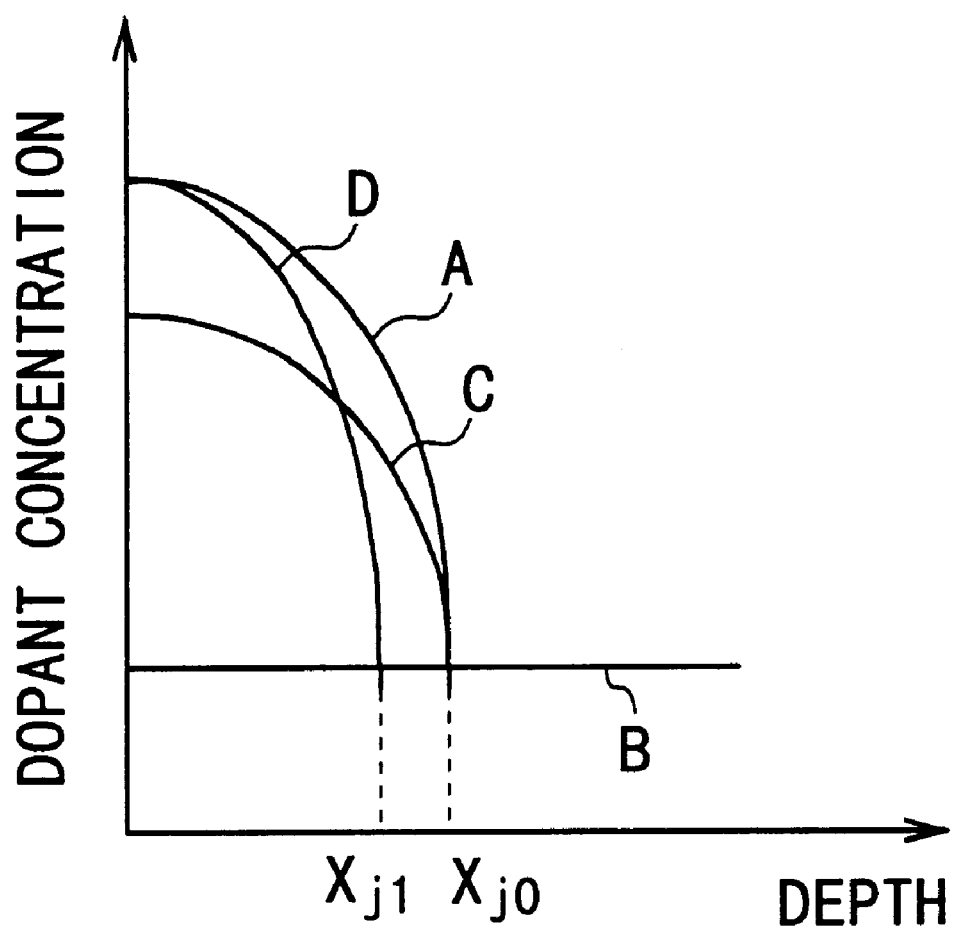
FIG. 2 schematically shows the profile of the dopant concentration of the pairs of p-type source/drain regions as a function of depth in the semiconductor device fabricated by the conventional method.

The state at this stage is shown in FIG. 3A. The above process steps are the same as those in the conventional method shown in FIGS. 1A to 1C.

Figure 3B:
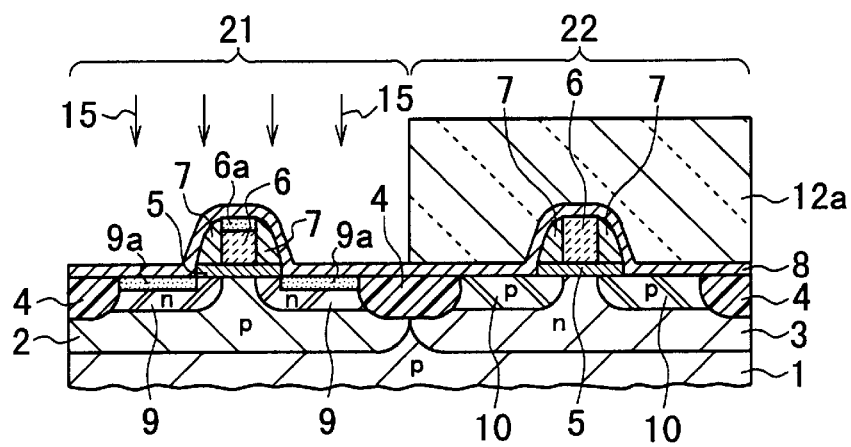

Following the annealing process, a patterned photoresist film 12a is formed to cover the PMOS region 22, as shown in FIG. 3B. Then, arsenic ions are selectively implanted into the pair of the n-type source/drain regions 9 and the gate electrode 6 in the NMOS region 21 through the $SiO_2$ layer 8 with a dose of 2 to $5 \times 10^{14}$ atoms/$cm^2$ (e.g., $3 \times 10^{14}$ atoms/$cm^2$) at an acceleration energy of 40 to 80 keV (e.g., 60 keV) while covering the PMOS region 22 with the photoresist film 12a, as indicated by vertical arrows 15 in FIG. 3B.

Thus, amorphous silicon region 6a is formed by the arsenic-implanted surface area of the gate electrode 6 in the NMOS region 21 and at the same time, amorphous silicon regions 9a are formed by the arsenic-implanted surface areas of the pairs of n- and p-type source/drain regions 9 in the NMOS region 21, respectively.

The reason because arsenic is selected for the ion-implantation species in this process is that arsenic has a largest mass number within the popularly-used n-type dopants in the semiconductor device fabrication and therefore, arsenic is optimum for this purpose.

Figure 3C:
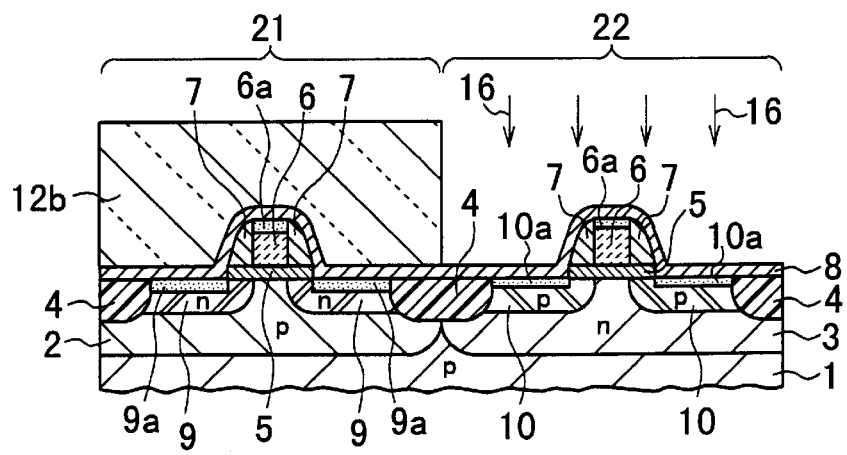

Further, after removing the photoresist film 12a, another patterned photoresist film 12b is formed to cover the NMOS region 21, as shown in FIG. 3C. Then, arsenic ions are selectively implanted into the pair of the p-type source/drain regions 10 and the gate electrode 6 in the PMOS region 22 through the $SiO_2$ layer 8 with a dose of 2 to $5 \times 10^{14}$ atoms/$cm^2$ (e.g., $3 \times 10^{14}$ atoms/$cm^2$) at an acceleration energy of 20 to 40 keV (e.g., 30 keV) while covering the NMOS region 21 with the photoresist film 12b, as indicated by vertical arrows 16.

Thus, amorphous silicon region 6a is formed by the surface area of the gate electrode 6 in the PMOS region 22 and at the same time, amorphous silicon regions 10a are formed by the surface areas of the pairs of p-type source/drain regions 10 in the PMOS region 22, respectively.

Because the acceleration energy (e.g., 60 keV) in the ion-implantation process of FIG. 3B is higher than the acceleration energy (e.g., 30 keV) in the ion-implantation process of FIG. 3C, the amorphous silicon regions 6a and 9a in the NMOS region 21 are thicker than the amorphous silicon regions 6a and 10a in the PMOS region 22.

Subsequently, the $SiO_2$ layer 8 is removed to expose the amorphous silicon regions 6a of the gate electrodes 6 and the amorphous silicon regions 9a and 10a of the pairs of source/drain regions 9 and 10 from the $SiO_2$ layer 8 using hydrogen fluoride (HF).

Then, a titanium (Ti) layer (not shown) with a thickness of 20 to 40 nm (e.g., 30 nm) is deposited to cover the entire surface of the substrate 1 by the sputtering technique. The titanium layer is contacted with the exposed amorphous silicon regions 6a of the gate electrodes 6 and the exposed amorphous silicon regions 9a and 10a of the pairs of source/drain regions 9 and 10.

The titanium layer and the entire substrate 1 are subjected to a heat treatment at a temperature of 650 to 750° C. (e.g., 700° C.) for 10 to 30 seconds (e.g., 10 seconds), thereby reacting the titanium layer with the amorphous silicon regions 6a of the gate electrodes 6 and the amorphous silicon regions 9a and 10a of the pairs of source/drain regions 9 and 10. Through this heat treatment, the titanium silicide ($TiSi_2$) layers 11 with a thickness of 30 to 60 nm (e.g., 45 nm) are formed in self-alignment to the gate electrodes 6 and the pairs of n- and p-type source/drain regions 9 and 10 in the NMOS and PMOS regions 21 and 22 due to silicidation reaction, respectively.

Because the amorphous silicon regions 6a and 9a in the NMOS region 21 are thicker than the amorphous silicon regions 6a and 10a in the PMOS region 22, the resultant titanium silicide ($TiSi_2$) layers formed 11 in the NMOS and PMOS regions 21 and 22 have substantially the same thickness.

Figure 3D:
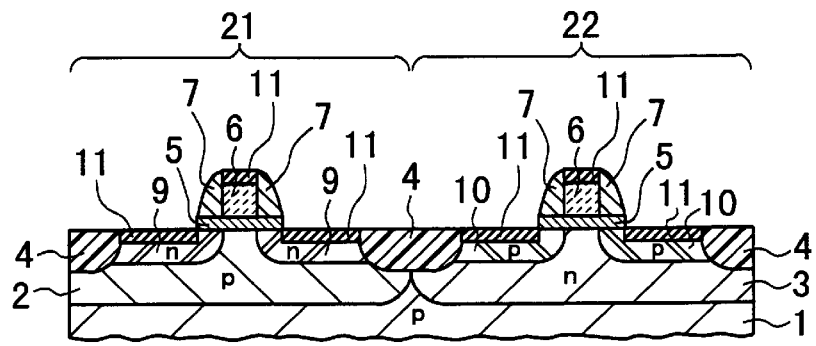

The unreacted titanium layer is then removed by immersing the assembly of the substrate 1 and the n- and p-channel MOSFETs into a mixture solution of ammonium hydroxide ($NH_4OH$) and hydrogen peroxide ($H_2O_2$). The state at this stage is shown in FIG. 3D.

Finally, the titanium silicide layers 11 are subjected to a heat-treatment at a temperature of 800 to 900° C. (e.g., 850°

C.) for 10 to 30 seconds (e.g., 30 seconds), thereby causing the phase transition in the layers 11 to decrease their electric resistivity.

With the fabrication method of a semiconductor device according to the first embodiment, arsenic ions as an n-type dopant are selectively implanted into the surface areas of the pair of n-type source/drain regions 9 and the surface area of the gate electrode 6 in the NMOS region 21 at the acceleration energy (e.g. 60 keV), thereby forming the amorphous regions 9a by the surface areas of the pair of n-type source/drain regions 9 and the amorphous region 6a by the gate electrode 6a in the NMOS region 21. Also, arsenic ions are implanted into surface areas of the pair of p-type source/drain regions 10 and the surface area of the gate electrode 6 in the PMOS region 22 at the acceleration energy (e.g., 30 keV) lower than the acceleration energy for the NMOS region 21, thereby forming the amorphous regions 10a by the surface areas of the second pair of p-type source/drain regions 10 and the gate electrode 6 in the PMOS region 22.

Moreover, the acceleration energy (e.g., 30 keV) for the PMOS region 22 is set in such a way that the bottoms of the pair of p-type source/drain regions 10 in the PMOS region 22 are not substantially shifted due to ion implantation of the arsenic ions for forming the amorphous regions 10a.

Therefore, the p–n junctions of the pair of p-type source/drain regions 10 in the PMOS region 22 do not become shallow even the arsenic ions as the n-type dopant are implanted into the pair of p-type source/drain regions 10 in the step shown in FIG. 3C. This means that the junction leakage current in the p-channel MOSFET is prevented from increasing.

Further, by setting the acceleration energy for the NMOS region 21 in such a way that the amorphous regions 11 in the NMOS region 21 have a satisfactorily large thickness, the sheet resistance of the silicide layers 11 in the n-channel MOSFET can be suppressed at a satisfactorily low level.

FIG. 4 schematically shows the profile of the dopant concentration of the pairs of p-type source/drain regions 10 in the PMOS region 22 as a function of depth.

In FIG. 4, the curve A' indicates the dopant concentration distribution due to the boron-difluoride-ion implantation for forming the pair of p-type source/drain regions 10. The straight line B' indicates the dopant concentration distribution of the n-type well region 3. The curve C' indicates the dopant concentration distribution due to the arsenic-ion implantation for forming the amorphous silicon regions 10a in the pair of p-type source/drain regions 10.

As seen from FIG. 4, the depth (or, thickness) $X_{j0}$ of the p–n junctions of the pair of p-type source/drain regions 10 before the arsenic-ion implantation for forming the amorphous silicon regions 10a is given by the intersection of the curve A' and the straight line B'. The (or, thickness) depth $X_{j1}$ of the p–n junctions of the pair of p-type source/drain regions 10 after the arsenic-ion implantation for forming the amorphous silicon regions 10a is given by the same intersection of the curve A' and the straight line B'. Thus, the depth $X_{j1}$ is equal to the depth $X_{j0}$.

This is caused by the fact that the implanted arsenic ions for forming the amorphous regions 10a do not reach the tail or bottom of the distribution of the implanted p-type dopant (i.e., $BF_2$) in the pair of p-type source/drain regions 10. Therefore, the tail or bottom of the distribution of the implanted p-type dopant is not raised toward the surfaces of the regions 10. In other words, the p–n junctions of the pair of p-type source/drain regions 10 do not become shallow, and consequently, the bottoms of the titanium silicide layers 11 and the p–n junctions of the regions 10 are sufficiently apart from one another. Accordingly, the junction leakage current of the pair of p-type source/drain regions 10 in the PMOS region 22 does not increase.

Concretely, to limit the sheet resistance of the titanium silicide layer 11 in the gate electrode 6 of the PMOS region 22, which has a gate length of approximately 0.15 μm, at 10 Ω/□ or less, it is sufficient that the acceleration energy of arsenic for forming the amorphous regions 11 is set as approximately 30 keV. In this case, the tail or bottom of the implanted arsenic ions will have a depth of 0.1 μm or less. Thus, the bottom or tail of the distribution of the implanted p-type dopant (i.e., $BF_2$ ions) for forming the p-type source/drain regions 10 is not affected by the implanted n-type dopant (i.e., As ions).

It is needless to say that the sheet resistance of the titanium silicide layer 11 in the gate electrode 6 of the NMOS region 21, which has a gate length of approximately 0.15 μm, is set as 10 Ω/□ or less. This is because arsenic ions for forming the amorphous silicon region 9a are implanted at the acceleration energy of approximately 60 keV or higher.

SECOND EMBODIMENT

A fabrication method of a semiconductor device with the CMOS structure according to a second embodiment of the present invention includes the steps as shown in FIGS. 5A to 5D.

Figure 5A:
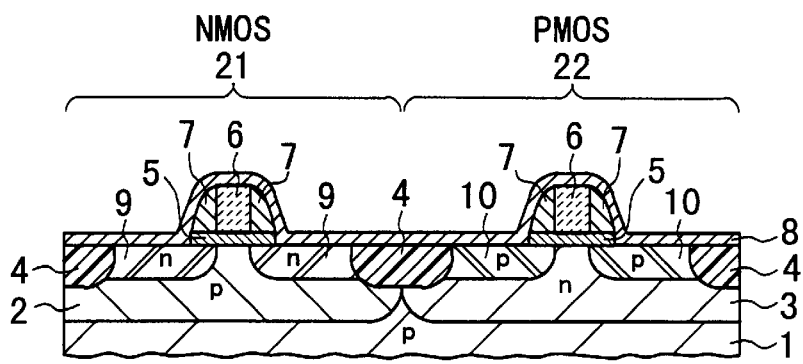
FIGS. 5A to 5D are partial, cross-sectional views showing a fabrication method of a semiconductor device with the CMOS structure according to a second embodiment of the present invention, respectively.

First, as shown in FIG. 5A, a field oxide layer 4 with a thickness of 200 to 400 nm (e.g., 300 nm) is selectively formed in the surface area of a p-type single-crystal silicon substrate 1 by the selective oxidation technique, thereby defining an NMOS region 21 where an n-channel MOSFET is formed and a PMOS region 22 where a p-channel MOSFET in the surface area of the substrate 1.

Next, a p-type well region 2 and an n-type well region 3 are formed in the NMOS and PMOS regions 21 and 22 by the ion-implantation technique, respectively.

Then, gate oxide layers 5 with a thickness of 3 to 6 nm (e g., 5 nm) are formed on the exposed surfaces of the NMOS and PMOS regions 21 and 22 by the thermal oxidation technique. Subsequently, polysilicon gate electrodes 6 with a thickness of 150 to 250 nm (e.g., 200 nm) are formed on the gate oxide layers 5 in the NMOS and PMOS regions 21 and 22 by the CVD, photolithography, and etching techniques.

Pairs of oxide sidewalls 7 with a width of 80 to 150 nm (e.g., 100 nm) are then formed on the gate oxide layers 5 at each side of the corresponding gate electrodes 6 in the NMOS and PMOS regions 21 and 22 by using the CVD technique and the anisotropically etching technique.

A silicon dioxide ($SiO_2$) layer 8 with a thickness of 5 to 10 nm (e.g., 10 nm) is formed to entirely cover the NMOS and PMOS regions 21 and 22 by the CVD technique.

Further, a pair of n-type source/drain regions 9 and a pair of p-type source/drain regions 10 are formed in the NMOS and PMOS regions 21 and 22 by the ion-implantation technique and the annealing technique, respectively.

When the pair of r-type source/drain regions 9 are formed in the NMOS region 21, arsenic (As) ions as an n-type dopant are selectively implanted into the NMOS region 21 with a dose of 2 to $5 \times 10^{15}$ atoms/cm$^2$ (e.g., $3 \times 10^{15}$ atoms/cm$^2$) at an acceleration energy of 20 to 50 keV (e.g., 30 keV) while the PMOS region 22 is covered with a patterned photoresist film (not shown). When the pair of p-type source/drain regions 10 are formed in the PMOS region 22, boron difluoride (BF$_2$) ions as a p-type dopant are selectively implanted into the PMOS region 22 with a dose of 2 to 5×10$^{15}$ atoms/cm$^2$ (e.g., 3×10$^{15}$ atoms/cm$^2$) at an acceleration energy of 20 to 50 keV (e.g., 20 keV) while the NMOS region 21 is covered with a patterned photoresist film (not shown).

The pair of n-type source/drain regions 9 and the pair of p-type source/drain regions 10 thus formed are then subjected to an annealing process for activating the implanted arsenic and boron atoms. This annealing process is typically carried out at a temperature of 1000 to 1050° C. (e.g., 1050° C.) for 10 to 30 seconds (e.g., 10 seconds).

The state at this stage is shown in FIG. 5A. The above process steps are the same as those in the method according to the first embodiment.

Figure 5B:
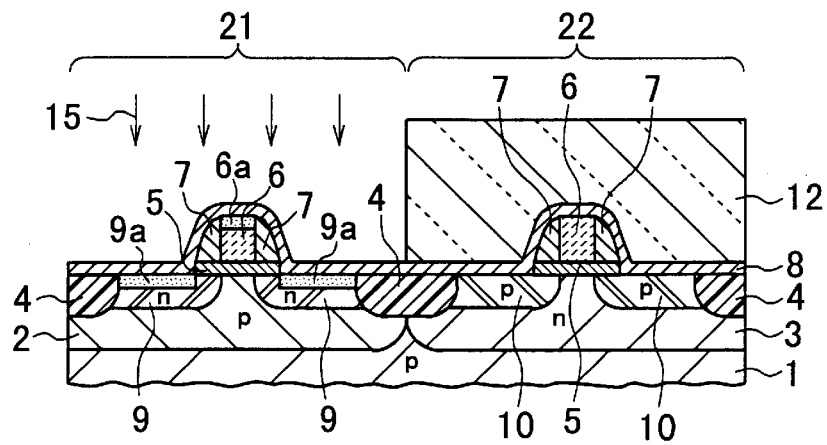

Following the annealing process, a patterned photoresist film 12 is formed to cover the PMOS region 22, as shown in FIG. 5B. Then, arsenic ions are selectively implanted into the pair of the n-type source/drain regions 9 and the gate electrode 6 in the NMOS region 21 through the SiO$_2$ layer 8 with a dose of 2 to 5×10$^{14}$ atoms/cm$^2$ (e.g., 3×10$^{14}$ atoms/cm$^2$) at an acceleration energy of 40 to 80 keV (e.g., 60 keV) while covering the PMOS region 22 with the photoresist film 12, as indicated by vertical arrows 15.

Thus, amorphous silicon region 6a is formed by the arsenic-implanted surface area of the gate electrode 6 in the NMOS region 21 and at the same time, amorphous silicon regions 9a are formed by the arsenic-implanted surface areas of the pairs of n- and p-type source/drain regions 9 in the NMOS region 21, respectively.

Further, after removing the photoresist film 12, arsenic ions are implanted into the pairs of the n- and p-type source/drain regions 9 and 10 and the gate electrodes 6 in the NMOS and PMOS region 21 and 22 through the SiO$_2$ layer 8 with a dose of 2 to 5×10$^{14}$ atoms/cm$^2$ (e.g., 3×10$^{14}$ atoms/cm$^2$) at an acceleration energy of 20 to 40 keV (e.g., 30 keV) without using any mask, as indicated by vertical arrows 16.

Figure 5C:
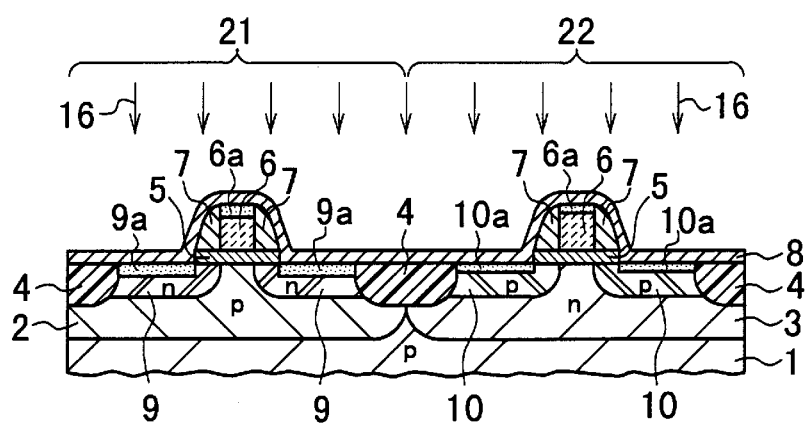
Figure 5D:
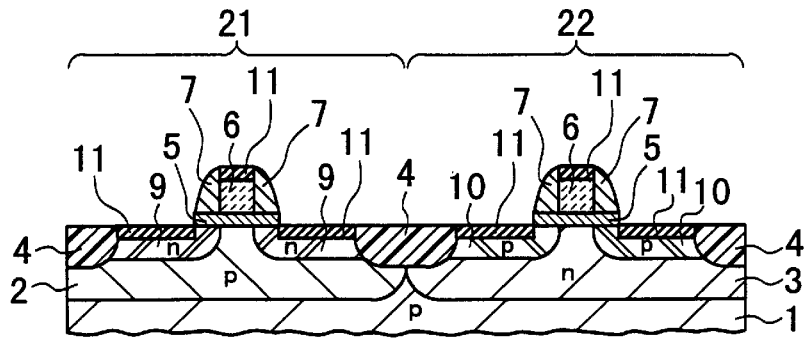

The method according to the second embodiment is different from the method according to the first embodiment in that no mask is used in the ion-implantation process shown in FIG. 5C.

Thus, amorphous silicon region 6a is formed by the surface area of the gate electrode 6 in the PMOS region 22 and at the same time, amorphous silicon regions 10a are formed by the surface areas of the pairs of p-type source/drain regions 10 in the PMOS region 22, respectively.

The subsequent process steps are the same as those in the first embodiment and therefore, the explanation is omitted here for the sake of simplification.

With the fabrication method of a semiconductor device according to the second embodiment, there is an additional advantage that no formation process (i.e., photolithography process) of a mask for covering the NMOS region 21 is necessary in the step of FIG. 5C, together with the same advantage as the first embodiment.

THIRD EMBODIMENT

A fabrication method of a semiconductor device with the CMOS structure according to a third embodiment of the present invention includes the steps as shown in FIGS. 6A to 6E.

Figure 6A:
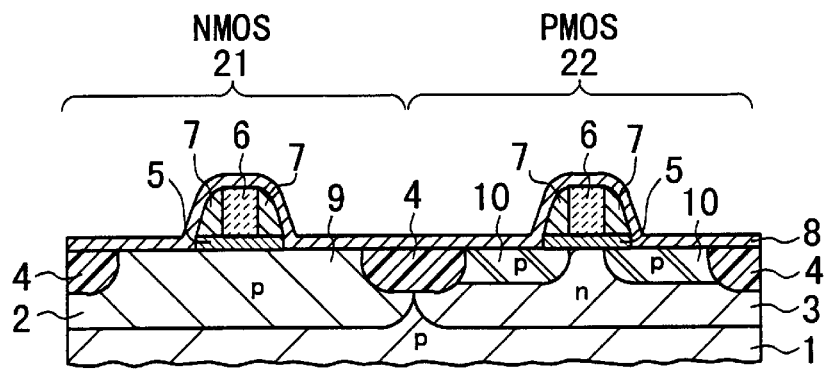
FIGS. 6A to 6E are partial, cross-sectional views showing a fabrication method of a semiconductor device with the CMOS structure according to a third embodiment of the present invention, respectively.

First, as shown in FIG. 6A, a field oxide layer 4 with a thickness of 200 to 400 nm (e.g., 300 nm) is selectively formed in the surface area of a p-type single-crystal silicon substrate 1 by the selective oxidation technique, thereby defining an NMOS region 21 where an n-channel MOSFET is formed and a PMOS region 22 where a p-channel MOSFET in the surface area of the substrate 1.

Next, a p-type well region 2 and an n-type well region 3 are formed in the NMOS and PMOS regions 21 and 22 by the ion-implantation technique, respectively.

Then, gate oxide layers 5 with a thickness of 3 to 6 nm (e.g., 5 nm) are formed on the exposed surfaces of the NMOS and PMOS regions 21 and 22 by the thermal oxidation technique. Subsequently, polysilicon gate electrodes 6 with a thickness of 150 to 250 nm (e.g., 200 nm) are formed on the gate oxide layers 5 in the NMOS and PMOS regions 21 and 22 by the CVD, photolithography, and etching techniques.

Pairs of oxide sidewalls 7 with a width of 80 to 150 nm (e.g., 100 nm) are then formed on the gate oxide layers 5 at each side of the corresponding gate electrodes 6 in the NMOS and PMOS regions 21 and 22 by using the CVD technique and the anisotropically etching technique.

A silicon dioxide (SiO$_2$) layer 8 with a thickness of 5 to 10 nm (e.g., 10 nm) is formed to entirely cover the NMOS and PMOS regions 21 and 22 by a known technique.

The state at this stage is shown in FIG. 6A.

The above process steps are the same as those in the method according to the first embodiment.

Further, a pair of p-type source/drain regions 10 are formed in the PMOS region 22 by the ion-implantation technique and the annealing technique. In this process, boron difluoride ions are selectively implanted into the PMOS region 22 with a dose of 2 to 5×10$^{15}$ atoms/cm$^2$ (e.g., 3×10$^{15}$ atoms/cm$^2$) at an acceleration energy of 20 to 50 keV (e.g., 30 keV) while the NMOS region 21 is covered with a patterned photoresist film (not shown).

Figure 6B:
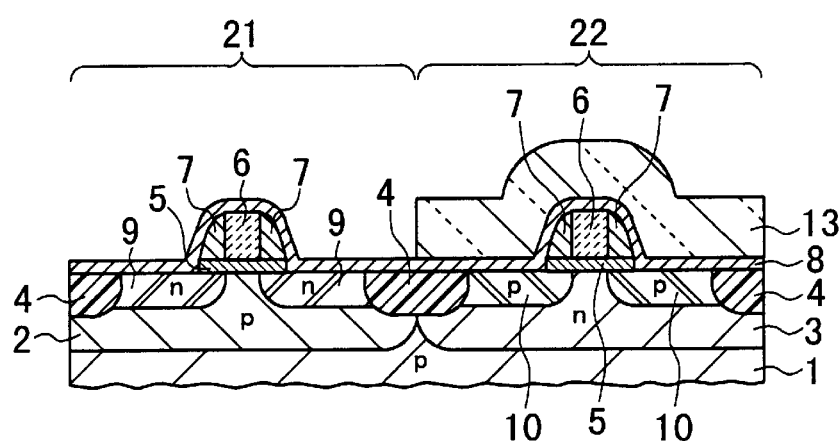

Then, as shown in FIG. 6B, the pair of n-type source/drain regions 9 are then formed in the NMOS region 21 by selectively implanting arsenic ions into the NMOS region 21 with a dose of 2 to 5×10$^{15}$ atoms/cm$^2$ (e.g., 3×10$^{15}$ atoms/cm$^2$) at an acceleration energy of 20 to 50 keV (e.g., 20 keV) while the PMOS region 22 is covered with a patterned polysilicon layer 13 with a thickness of approximately 150 to 250 nm.

The state at this stage is shown in FIG. 6B.

The pair of n-type source/drain regions 9 and the pair of p-type source/drain regions 10 thus formed are then subjected to an annealing process for activating the implanted arsenic and boron atoms. This annealing process is typically carried out at a temperature of 1000 to 1050° C. (e.g., 1050° C.) for 10 to 30 seconds (e.g., 10 seconds).

Figure 6C:
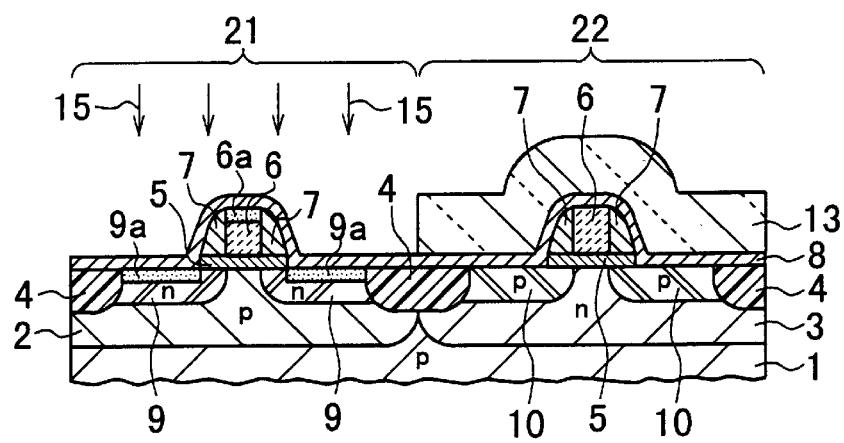

Following the annealing process, without removing the polysilicon layer 13, arsenic ions are selectively implanted into the pair of the n-type source/drain regions 9 and the gate electrode 6 in the NMOS region 21 through the SiO$_2$ layer 8 with a dose of 2 to 5×10$^{14}$ atoms/cm$^2$ (e.g., 3×10$^{14}$ atoms/cm$^2$) at an acceleration energy of 40 to 80 keV (e.g., 60 keV), as indicated by vertical arrows 15 in FIG. 6C.

Thus, amorphous silicon region 6a is formed by the arsenic-implanted surface area of the gate electrode 6 in the NMOS region 21 and at the same time, amorphous silicon regions 9a are formed by the arsenic-implanted surface areas of the pairs of n-type source/drain regions 9 in the NMOS region 21, respectively, as shown in FIG. 6C.

Figure 6D:
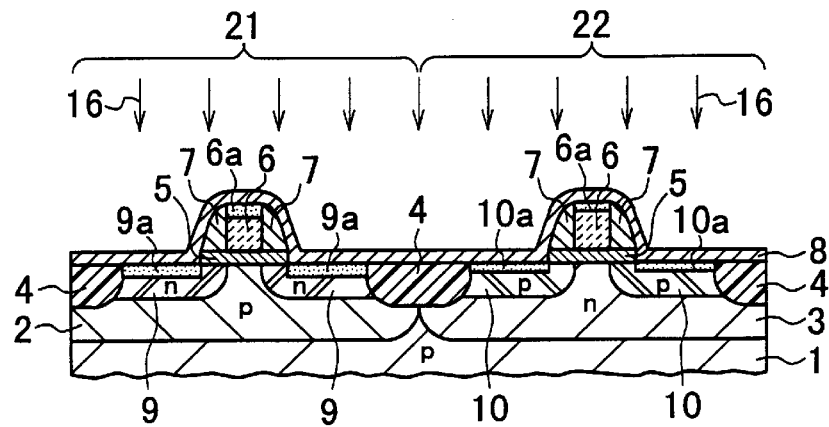
Figure 6E:
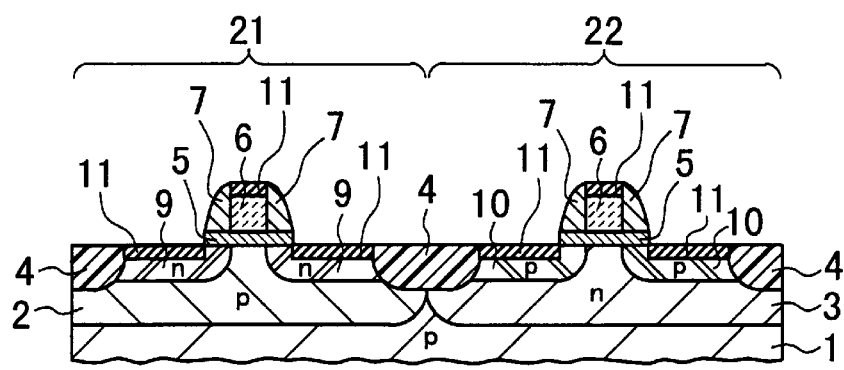

Further, after removing the polysilicon layer 13, as shown in FIG. 6D, arsenic ions are selectively implanted into the pairs of the n- and p-type source/drain regions 9 and 10 and the gate electrodes 6 in the NMOS and PMOS region 21 and 22 through the SiO$_2$ layer 8 with a dose of 2 to 5×10$^{14}$ atoms/cm$^2$ (e.g., 3×10$^{14}$ atoms/cm$^2$) at an acceleration energy of 20 to 40 keV (e.g., 30 keV), as indicated by vertical arrows 16 in FIG. 6D.

Thus, amorphous silicon region 6a is formed by the surface area of the gate electrode 6 in the PMOS region 22 and at the same time, amorphous silicon regions 10a are formed by the surface areas of the pairs of p-type source/drain regions 10 in the PMOS region 22, respectively.

In this ion-implantation process of FIG. 6D, the acceleration energy is, for example, set as 30 keV which is lower than that of 60 keV in the ion-implantation process of FIG. 6C. Therefore, the thickness of the amorphous silicon region 6a and 10a in the PMOS region 22 is smaller than that of the amorphous silicon region 6a and 9 in the NMOS region 21.

The method according to the third embodiment is different from the method according to the first embodiment in that the polysilicon mask 13 for forming the pair of n-type source/drain regions 9 is used in the ion-implantation process for forming amorphous regions 6a, 9a and 10a.

The subsequent process steps are the same as those in the first embodiment and therefore, the explanation is omitted here for the sake of simplification.

With the fabrication method of a semiconductor device according to the third embodiment, there is an additional advantage that no formation process (i.e., photolithography process) of a mask for covering the NMOS region 21 in the step of FIG. 6C is necessary in the step of FIG. 6C, together with the same advantage as the first embodiment.

In the above-described first to third embodiments, arsenic is used as an n-type dopant for forming amorphous silicon regions. However, antimony or phosphorus may be used instead of arsenic, in which antimony is better than phosphorus because of their mass numbers.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A fabrication method of a semiconductor device, comprising the steps of:

(a) defining an NMOS region in which an n-channel MOSFET and a PMOS region in which a p-channel MOSFET is formed in a semiconductor substrate;

(b) forming first and second gate electrodes over said NMOS and PMOS regions through first and second gate insulating layers, respectively;

(c) forming a first pair of n-type source/drain regions in said NMOS region;

(d) forming a second pair of p-type source/drain regions in said PMOS region;

(e) selectively ion-implanting an n-type dopant into surface areas of said first pair of n-type source/drain regions and a surface area of said first gate electrode in said NMOS region at a first acceleration energy, thereby forming a first plurality of amorphous regions by said surface areas of said first pair of n-type source/drain regions and said first gate electrode in said NMOS region;

(f) ion-implanting said n-type dopant into surface areas of said second pair of p-type source/drain regions and a surface area of said second gate electrode in said PMOS region at a second acceleration energy lower than said first acceleration energy, thereby forming second plurality of amorphous regions by said surface areas of said second pair of p-type source/drain regions and said second gate electrode in said PMOS region; said second acceleration energy being set in such a way that bottoms of said second pair of p-type source/drain regions in said PMOS region are not substantially shifted due to ion implantation of said n-type dopant for forming said second plurality of amorphous regions;

(g) forming a refractory metal layer to be contacted with said first plurality of amorphous regions in said NMOS region and said second plurality of amorphous regions in said PMOS region; and (h) heat-treating said refractory metal layer, said first plurality of amorphous regions in said NMOS region, and said second plurality of amorphous regions in said PMOS region to form silicide layers in self-alignment to said first and second gate electrodes and said first and second pluralities of said pairs of source/drain regions due to silicidation reaction.

2. A method as claimed in claim 1, wherein said step (e) is performed while selectively covering said PMOS region by a first mask, and said step (f) is performed while selectively covering said NMOS region by a second mask.

3. A method as claimed in claim 1, wherein said step (e) is performed while selectively covering said PMOS region by a mask, and said step (f) is performed while covering said NMOS and PMOS regions by no mask.

4. A method as claimed in claim 1, wherein said first pair of n-type source/drain regions are formed while selectively covering said PMOS region by a heat-resistant mask in said step (c) and then, said first pair of n-type source/drain regions are subjected to a heat treatment for annealing without removing said mask used in said step (c);

and wherein said step (e) is performed using said mask;

and wherein said step (f) is performed with or without said mask.

5. A method as claimed in claim 4, wherein said heat-resistant mask is made of polysilicon.

6. A method as claimed in claim 1, wherein said refractory metal layer is made of titanium.

7. A method as claimed in claim 1, wherein said n-type dopant is one selected from the group consisting of phosphorus, arsenic, and antimony.

* * * * *